United States Patent
Schuster

(10) Patent No.: US 7,092,069 B2
(45) Date of Patent: Aug. 15, 2006

(54) PROJECTION EXPOSURE METHOD AND PROJECTION EXPOSURE SYSTEM

(75) Inventor: Karl-Heinz Schuster, Koenigsbronn (DE)

(73) Assignee: Carl Zeiss Smt AG, Oberkochen (DE)

( * ) Notice: Subject to any disclaimer, the term of this patent is extended or adjusted under 35 U.S.C. 154(b) by 82 days.

(21) Appl. No.: 10/886,696

(22) Filed: Jul. 9, 2004

(65) Prior Publication Data

US 2005/0030506 A1    Feb. 10, 2005

Related U.S. Application Data

(63) Continuation-in-part of application No. 10/210,051, filed on Aug. 2, 2002, now Pat. No. 6,878,916, and a continuation-in-part of application No. PCT/EP02/04846, filed on May 3, 2002.

(30) Foreign Application Priority Data

| Mar. 8, 2002 | (DE) | ................ 102 10 899 |
| Jun. 28, 2002 | (DE) | ................ 102 29 818 |
| Jul. 9, 2003 | (DE) | ................ 103 32 112 |

(51) Int. Cl.
  *G03B 27/42* (2006.01)
  *G03B 27/52* (2006.01)
  *G02B 7/04* (2006.01)

(52) U.S. Cl. .................. 355/53; 355/55; 250/201.2

(58) Field of Classification Search .................. 355/52, 355/53, 55, 67–71; 356/399–401; 250/548, 250/201.2
See application file for complete search history.

(56) References Cited

U.S. PATENT DOCUMENTS

| 4,480,910 A | 11/1984 | Takanashi et al. |
| 4,509,852 A | 4/1985 | Tabarelli et al. |
| 4,870,452 A | 9/1989 | Tanimoto et al. |
| 4,871,237 A * | 10/1989 | Anzai et al. ................ 359/666 |

(Continued)

FOREIGN PATENT DOCUMENTS

DE    198 29 513 C2    1/2000

(Continued)

OTHER PUBLICATIONS

Hiroaki Kawata, et al, "Fabrication of 0.2 μM Fine Patterns Using Optical Projection Lithography With an Oil Immersion Lens", Japanese Journal of Applied Physics, vol. 31, pp. 4174-4177, Part 1, No. 12B, Dec. 1992, Tokyo Japan.

(Continued)

*Primary Examiner*—Henry Hung Nguyen
(74) *Attorney, Agent, or Firm*—Sughrue Mion, PLLC

(57) ABSTRACT

In a method for manufacturing semiconductor devices and other finely structured parts, a projection objective (5) is used in order to project the image of a pattern arranged in the object plane of the projection objective onto a photosensitive substrate which is arranged in the region of the image plane (12) of the projection objective. In this case, there is set between an exit surface (15), assigned to the projection objective, for exposing light and an incoupling surface (11), assigned to the substrate, for exposing light a small finite working distance (16) which is at least temporarily smaller in size and exposure time interval than a maximum extent of an optical near field of the light emerging from the exit surface. As a result, projection objectives with very high numerical apertures in the region of NA>0.8 or more can be rendered useful for contactless projection lithography.

40 Claims, 4 Drawing Sheets

U.S. PATENT DOCUMENTS

| | | |
|---|---|---|
| 5,094,536 A | 3/1992 | MacDonald et al. |
| 5,121,256 A | 6/1992 | Corle et al. |
| 5,191,200 A * | 3/1993 | van der Werf et al. .. 250/201.4 |
| 5,563,684 A | 10/1996 | Stagaman |
| 5,610,983 A | 3/1997 | Stewart |
| 5,783,833 A | 7/1998 | Sugaya et al. |
| 5,825,469 A | 10/1998 | Nam et al. |
| 5,900,354 A | 5/1999 | Batchelder |
| 6,560,031 B1 | 5/2003 | Shafer et al. |
| 2002/0005938 A1 | 1/2002 | Omura |
| 2002/0163629 A1 | 11/2002 | Switkes et al. |
| 2003/0206282 A1 | 11/2003 | Omura |
| 2005/0117224 A1 * | 6/2005 | Shafer et al. ............... 359/649 |

FOREIGN PATENT DOCUMENTS

| | | |
|---|---|---|
| EP | 0 023 231 A1 | 2/1981 |
| EP | 060 51 03 | 7/1994 |
| EP | 1 094 350 A2 | 4/2001 |
| EP | 1 139 138 A1 | 10/2001 |
| EP | 1 187 186 A1 | 3/2002 |
| JP | 101 48 947 A | 6/1998 |
| WO | WO 02/091078 A1 | 11/2002 |
| WO | WO 03/075097 A3 | 9/2003 |

OTHER PUBLICATIONS

Hiroaki Kawata, et al, "Optical Projection Lithography Using Lenses With Numerical Apertures Greater Than Unity", Microelectronic Engineering, Nos. 1-4, May 1989, Amsterdam, Netherlands.

Willi Ulrich, et al, Trends in Optical Design of Projection Lenses for UV-and EUV- Lithography, Proceedings of SPIE vol. 4146, pp. 13-24, Aug. 2000, Bellingham, Virginia.

M. Switkes and M. Rothschild "Immersion Lithography at 157 NM", J. Vac. Sci. Technol. B 19(6), pp. 2353-2356, Nov./Dec. 2001.

J.E. Van Der Werf, "Optical Focus and Level Sensor for Wafer Steppers", American Vacuum Society, Mar./Apr. 1992, J.Vac. Sci. Technol. B 10(2), pp. 735-740.

* cited by examiner

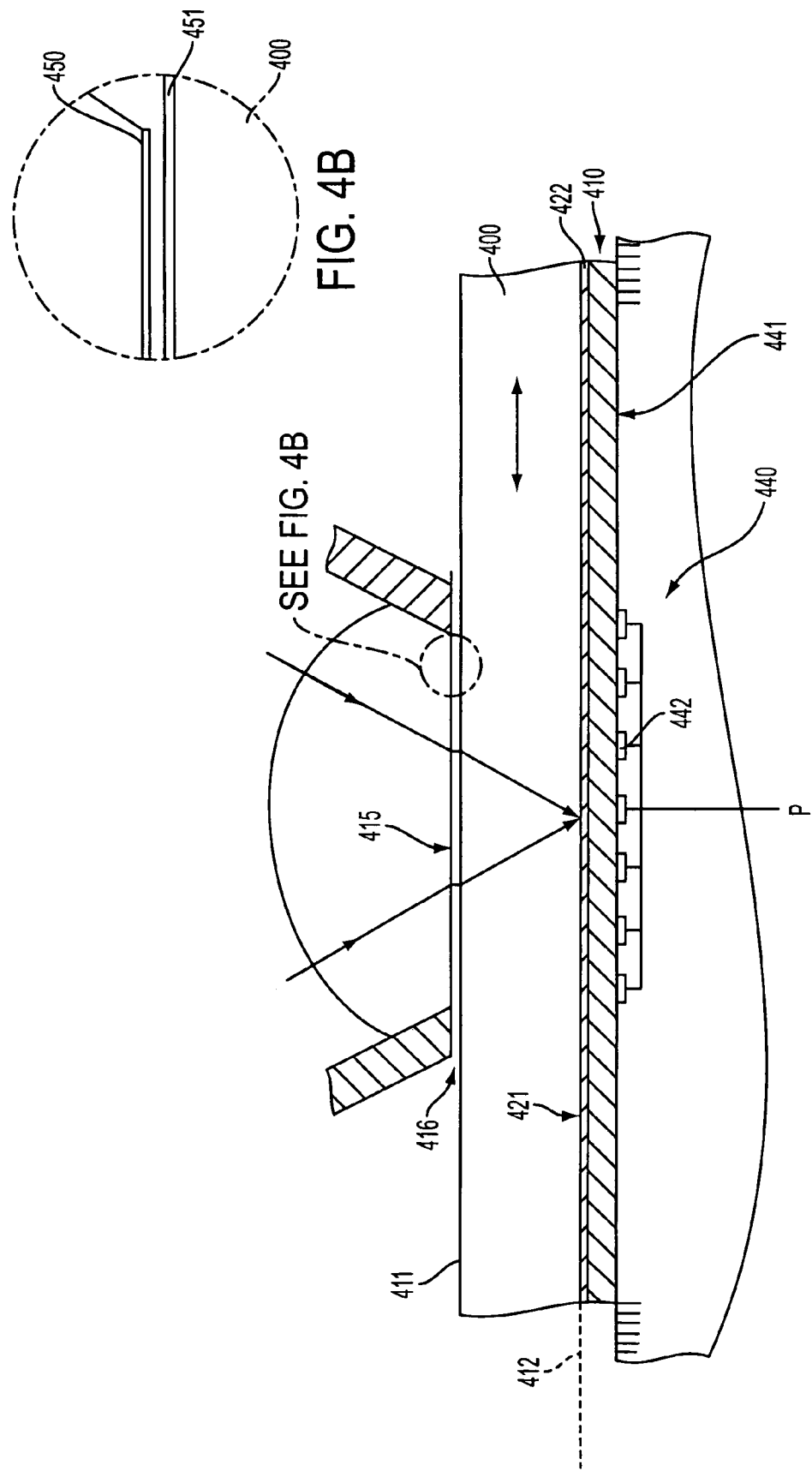

PROJECTION EXPOSURE METHOD AND PROJECTION EXPOSURE SYSTEM

This is a Continuation-In-Part Application of Application Ser. No. 10/210,051, filed Aug. 2, 2002, now U.S. Pat. No. 6,878,916 which claims benefit of the German Patent Application No. 102 29 818.1 filed on Jun. 28, 2002, and is further a Continuation-In-Part Application of International Application No. PCT/EP02/04846, filed on May 3, 2002, which claims benefit of the German Patent Application No. 102 10 899.4 filed on Mar. 8, 2002. The disclosures of application Ser. No. 10/210,051 and of application Ser. No. 10/379,809 filed on Mar. 6, 2003 are incorporated into this Continuation-In-Part-Application by reference. Benefit is further claimed of the German Patent Application No. 103 32 112.8 filed on Jul. 9, 2003, the disclosure of which is also incorporated by reference.

BACKGROUND OF THE INVENTION

1. Field of the Invention

The invention relates to methods for manufacturing semiconductor devices and other finely structured components, and to projection exposure systems for carrying out the methods.

2. Description of the Related Art

Photolithographic projection objectives have been used for several decades to manufacture semiconductor devices and other finely structured components. They serve the purpose of projecting patterns of photomasks or lined plates, also referred to below as masks or reticles, onto a photosensitive substrate, for example a semiconductor wafer coated with a photosensitive layer, with very high resolution on a demagnifying scale.

A number of approaches are followed in order to produce ever finer structures of the order of magnitude of 100 nm or therebelow. Firstly, an attempt is made to increase the image-side numerical aperture (NA) of the projection objective beyond the currently achievable values in the range of NA=0.8 or above. Again, ever shorter operating wavelengths of ultraviolet light are being used, preferably wavelengths of less than 260 nm, for example 248 nm, 193 nm, 157 nm or therebelow. Finally, yet other measures are being used to increase resolution, for example phase-shifting masks and/or oblique illumination.

The shortening of the operating wavelength λ in the region below 193 nm is rendered difficult by virtue of the fact that only a few sufficiently transparent materials, in particular fluoride crystals such as calcium fluoride or barium fluoride, are available for manufacturing lenses for this wavelength region. These materials are available only to a limited extent and present a problem with regard to their birefringent properties at 193 nm and, in particular, at 157 nm.

When the aperture is increased substantially above NA=0.85, limits are reached for the angle load, especially for lenses near the image. Larger apertures than NA=0.95 as far as NA=1 are regarded as infeasible. At apertures of NA>1, the edge and coma rays can no longer be coupled out of an objective, because of total reflection.

The use of immersion fluids between the projection objective and substrate can theoretically be used for the purpose of implementing numerical apertures NA greater than 1. However, practical systems for immersion lithography have not yet been published.

OBJECTS OF THE INVENTION

It is one object of the invention to provide a projection exposure method and a corresponding projection exposure system which permit a projection exposure in conjunction with very high numerical apertures. It is another object to provide a projection exposure method and a corresponding projection exposure system which permit projection exposure at image side numerical apertures NA≧1 without use of an immersion fluid in contact with an exit side of a projection objective.

SUMMARY OF THE INVENTION

As a solution to these and other objects, this invention, according to one formulation, provides a method for manufacturing a method according to the invention for manufacturing semiconductor devices and other finely structured components having the following steps:
providing a mask with a prescribed pattern in an object plane of a projection objective;
providing a photosensitive substrate in the region of the image plane of the projection objective;
illuminating the pattern with ultraviolet light of a prescribed operating wavelength;
projecting an image of the pattern onto the photosensitive substrate with the aid of the projection objective;
setting a finite working distance between an exit surface, assigned to the projection objective, for exposing light and an incoupling surface, assigned to the substrate, for exposing light,
the working distance being set inside an exposure time interval at least temporarily to a value which is smaller than a maximum extent of an optical near field of the light emerging from the exit surface.

Advantageous developments are specified in the dependent claims. The wording of all the claims is included in the description by reference.

The invention therefore proposes a contactless projection exposure process in which evanescent fields of the illuminating light which are in the immediate vicinity of the exit surface are rendered useful for the lithographic process. It has emerged that given sufficiently small (finite) working distances it is possible despite geometrical conditions of total reflection to couple out a light fraction useful for lithography from the exit surface of the objective, and to couple it into an incoupling surface directly adjacent at a distance.

It has proved that incoupling of illuminating light with an incoupling intensity close to zero given numerical apertures above NA=1 begins at a working distance which corresponds approximately to four times the operating wavelength λ. It is therefore preferred when a working distance which is less than four times the operating wavelength is set, at least temporarily. In particular, the working distance should, at least temporarily, be less than approximately 50% of the operating wavelength. If working distances of 20% or less of the operating wavelength are set at least temporarily, it is possible to achieve typical incoupling levels of approximately 20% or more. A region which is useful for lithography begins with an incoupling level of approximately 20% for the photoresist materials currently available. In order to achieve higher coupling efficiencies, the working distance should be less than 10% or less than 5% of the operating wavelength for at least a portion of the exposure time. Projection objectives for the contactless near field projection lithography proposed here correspondingly preferably have typical working distances in the region of the operating wavelength or therebelow, for example between approximately 3 nm and approximately 200 nm, in particular between approximately 5 nm and approximately 100 nm. It is favourable in general when the working distance is adapted to the other properties of the projection system (properties of the projection objective near the exit surface, properties of the substrate near the incoupling surface) such that an incoupling efficiency of at least 10% is achieved. The term "incoupling efficiency" here designates the ratio of the transmission of the maximum edge or coma rays to the transmission of the chief rays during coupling out from the objective and during coupling into the resist, a mean value for various directions of polarization (s- and p-components being considered here. The incoupling is a function of the polarization and the refractive index quotients of the interface components. For apertures NA>1.0, the tangential polarization (comparable to p-polarization) supplies substantially better contrasts irrespective of whether incoupling is performed via an immersion medium or via a near field. The incoupling efficiency can fluctuate substantially depending on distance, degree of polarization and angle of incidence. The values in the following table, which specifies the incoupling efficiency as a function of the near field distance or working distance normalized to the operating wavelength can be regarded as guide values averaged over different angles of incidence, directions of polarization and mean refractive index quotients for NA>1.0.

| Near field distance [λ] | Incoupling efficiency |
|---|---|
| 1.00 | 0.02 |
| 0.70 | 0.06 |
| 0.50 | 0.08 |
| 0.40 | 0.10 |
| 0.30 | 0.15 |
| 0.20 | 0.25 |
| 0.15 | 0.38 |
| 0.10 | 0.65 |
| 0.07 | 0.81 |
| 0.05 | 0.90 |
| 0.03 | 0.95 |
| 0.00 | 1.00 |

In near field projection lithography, the short working distance should be present with local distance fluctuations which are as small as possible over the entire surface to be exposed, in order to keep local variations in incoupled light intensity as small as possible. Since the exit surface of the projection objective is preferably substantially flat, a substantially flat incoupling surface is the aim for a uniform working distance. In order to achieve this despite a possibly uneven surface of the substrate to be exposed, in one embodiment of the method a coating of the substrate with at least one planarization layer is provided for producing a substantially flat substrate surface which can serve as incoupling surface. The single ply or multiply planarization layer can be formed by a photoresist layer or resist layer. In addition to the photosensitive resist material, it is also possible to apply a layer made from a material serving as planarization medium and which is sufficiently transparent to the operating wavelength but, if appropriate, does not itself exhibit any structural changes owing to exposure.

In order to set and maintain a suitable, small working distance between the exit surface and incoupling surface, a development provides a focusing technique which is adapted, in particular, to small working distances. With this technique, a measurement beam is irradiated at a flat angle into the object-side end region of the projection objective or between the exit surface and incoupling surface in such a way that after exiting from an incoupling system of the focus detection device it is firstly reflected to and fro once or several times on a zigzag path between suitable reflecting surfaces before passing into an outcoupling system of the focus detection device. Consequently, a measurement beam with a relatively large irradiation angle can be directed onto the incoupling surface even given a small working distance. Focus detection systems with a grazing incidence of light can also be used in this way for projection objectives having a very small working distance. A preferred focus detection system of the applicant is disclosed in German Patent Application DE 102 29 818, corresponding to U.S. Ser. No. 10/210,051. The disclosures of both applications are incorporated in their entirety into this description by reference.

In one embodiment, the last optical element of the projection objective is used as a beam-guiding part, capable of being transirradiated, of a focus detection system. For this purpose, the last optical element can have an edge region where there is constructed at at least one point a flat surface, aligned obliquely to the optical axis, for incoupling and/or outcoupling a measurement beam of the focus detection system. Via the incoupling surfaces and outcoupling surfaces, a measurement beam can be coupled into the last optical element and, if appropriately after single or multiple reflection at boundary surfaces of the last optical element, can be coupled out of the exit surface, and after reflection at the incoupling surface of the substrate can, if appropriate, be coupled again into the last optical element.

In accordance with one development, a particular holding technique for the substrate, in particular for a thin semiconductor wafer, is provided in order to maintain a small working distance which is as uniform as possible over the entire surface to be exposed, at least during a portion of the exposure time. The substrate holding device permits a controlled deformation of the substrate in order to set a desired form of the incoupling surface in active fashion. In particular, a substantially flat substrate surface or incoupling surface can be produced. For this purpose, in one embodiment an active support of the substrate is provided on at least three supporting surfaces of support members. In order, in the case of a substrate which can be deformed in a limited fashion, to bring its surface to the desired, for example flat form, the axial position of at least one of the supporting surfaces can be adjusted specifically relative to the other supporting surfaces in order to deform the substrate mounted thereupon. In order to achieve exact control of the form and position of the incoupling surface by the substrate holding device and the support members thereof, it is provided in one development that the substrate is pressed against the support members by producing an underpressure on the side of the substrate averted from the incoupling surface. The substrate is then pressed onto the supporting surfaces, possibly positioned at different heights, by the ambient pressure bearing down on the incoupling surface, and a targeted deformation of the substrate is thereby achieved. Furthermore, the substrate holding device can be fashioned such that it permits an axial adjustment of the entire substrate and/or a tilting about one or more axes in order to bring the incoupling surface into the correct spatial relationship with the exit surface of the illuminating light.

There are a number of possibilities for actively supporting a substrate by means of controlled supporting points. One possibility consists in that, before the exposure, the surface to be exposed, for example a wafer surface, is examined for surface deformations by using appropriate measuring methods, for example interferometrically, and thereafter minimizing the surface deformation such that it is, for example, smaller than 3 nm with reference to a profile of a preferably flat desired surface. It is then possible to carry out focusing, tilting if appropriate, and exposure. Deformations before and/or during an exposure in conjunction with focusing and/or detection of the surface form are likewise possible.

Heavier contamination of the exit surface can come about because of the small working distance. It is possible thereby for the imaging quality and the throughput of exposed substrates to decrease. In order to provide a remedy here, it is provided in one development that the last optical element, at which the exit surface is located, is formed by a relatively thin, transparent plate with which the last but one optical element, for example a plano-convex lens, can make optical contact by wringing, for example. Such an exchangeable end plate can be detached, cleaned and wrung anew thereafter, or be replaced by another end plate at suitable time intervals. Wringing as an optically neutral joining technique is to be selected chiefly whenever apertures of NA>1 are to be transmitted. Alternatively, the thin plate can be optically coupled to the last but one optical element by means of an immersion medium, for example an immersion liquid.

Contamination problems can also be avoided or diminished by laying a transparent plane plate onto the substrate in such a way that an objective-side plane surface, averted from the substrate, of the plane plate forms the incoupling surface. The plane plate can, for example, be laid onto the substrate such that there is physical contact with the top side of the substrate at least in some regions. It is also possible for a region between the substrate-side plane surface of the plane plate and the top side of the substrate to be filled by an immersion medium, for example pure water, in part or completely. In this case, when use is made of this plane plate, which can also be designated as a plane-parallel plate or as an auxiliary plate, the small working distance, to be bridged by the near field, is formed between the objective-side plane surface of the auxiliary plate and the exit surface of the projection objective. In this variant method, the optical properties of the projection objective are coordinated with the media to be inserted between its exit surface and the substrate to be exposed such that imaging with high resolution is possible. Irrespective of whether they are provided at the objective as an exchangeable plate or as an auxiliary plate, detached from the objective, on the wafer, all the plates can be split off from a thick, plano-convex objective lens if the same or approximately the same refractive index is provided for the plate and the lens. Consequently, sufficiently thick plano-convex lenses are favourable as last lenses of the objective.

The plane plate can be so large that substantially the entire area of the substrate to be exposed is covered. A plane plate of this type can be used repeatedly, but should be cleaned at suitable time intervals, for example after each exposure cycle. It is possible, for example, to use plane plates with a wafer diameter of 200 mm or 300 mm for manufacturing semiconductors. During exposure, there is then a relative displacement between the projection objective and plane plate in order to expose successively all the regions of the substrate which is to be exposed. It is possible for the plane plate serving as auxiliary plate to be laid without immersion directly after the application and drying of the photosensitive layer in vacuum, and for the substrate with the auxiliary plate laid thereon to be transported to the exposure system.

In this case, the auxiliary plate can serve as protective plate for the substrate, a twofold passage through an optical near field taking place.

In order to avoid defocusing errors, the part of the substrate to be exposed should bear as effectively as possible against the substrate-side plane surface. If this cannot be achieved simply by laying the plane plate on, it is also possible for the substrate to be actively pressed against the substrate-side plane surface so as to produce physical contact, at least during the exposure. It is possible for this purpose, for example, to produce an overpressure, which presses the substrate against the plane plate, on the side of the substrate averted from the plane plate. It is not necessary in this case for the physical contact to be maintained over the entire substrate surface. It is sufficient if in each case the region to be exposed and, if appropriate, its adjacent regions are pressed on. It can therefore be sufficient to provide suitable outlet ducts for a pressure fluid in the region of the extension of the optical axis of the projection objective onto a substrate holder.

It is to be ensured that the plane plate or auxiliary plate is of high optical quality with reference to material properties such as transmission, homogeneity and boundary surface properties such as dimensions, cleanliness and plane-parallelism. This auxiliary plate is also to be incorporated into the optical calculations as a constituent of the optical design when constructing the projection objective. If the refractive indices of a last optical element of the projection objective, for example of a plano-convex lens, and the plane-parallel plate deviate from one another, because, for example, the lens is fabricated from calcium fluoride, and the auxiliary plate is fabricated from silica glass, this is to be taken into account in the optical calculations, either from the very beginning or by later spherical adaptation.

The above features and further ones also proceed from the description and from the drawings in addition to from the claims. In this case, the individual features can respectively be implemented solely for themselves or severally in the form of subcombinations in the case of an embodiment of the invention and in other fields, and can advantageously constitute embodiments capable of protection per se.

BRIEF DESCRIPTION OF THE DRAWINGS

The preceding and other properties may be seen both in the claims and in the description and the drawings, wherein the individual characteristics involved may be used either alone or in sub-combinations as an embodiment of the invention and in other areas, and may individually represent advantageous and patentable embodiments.

FIGS. 4A and 4B are diagrammatic illustrations which show the use of a transparent plane plate during the projection exposure in accordance with one embodiment of the invention.

DETAILED DESCRIPTION OF THE PREFERRED EMBODIMENTS

Figure 1:
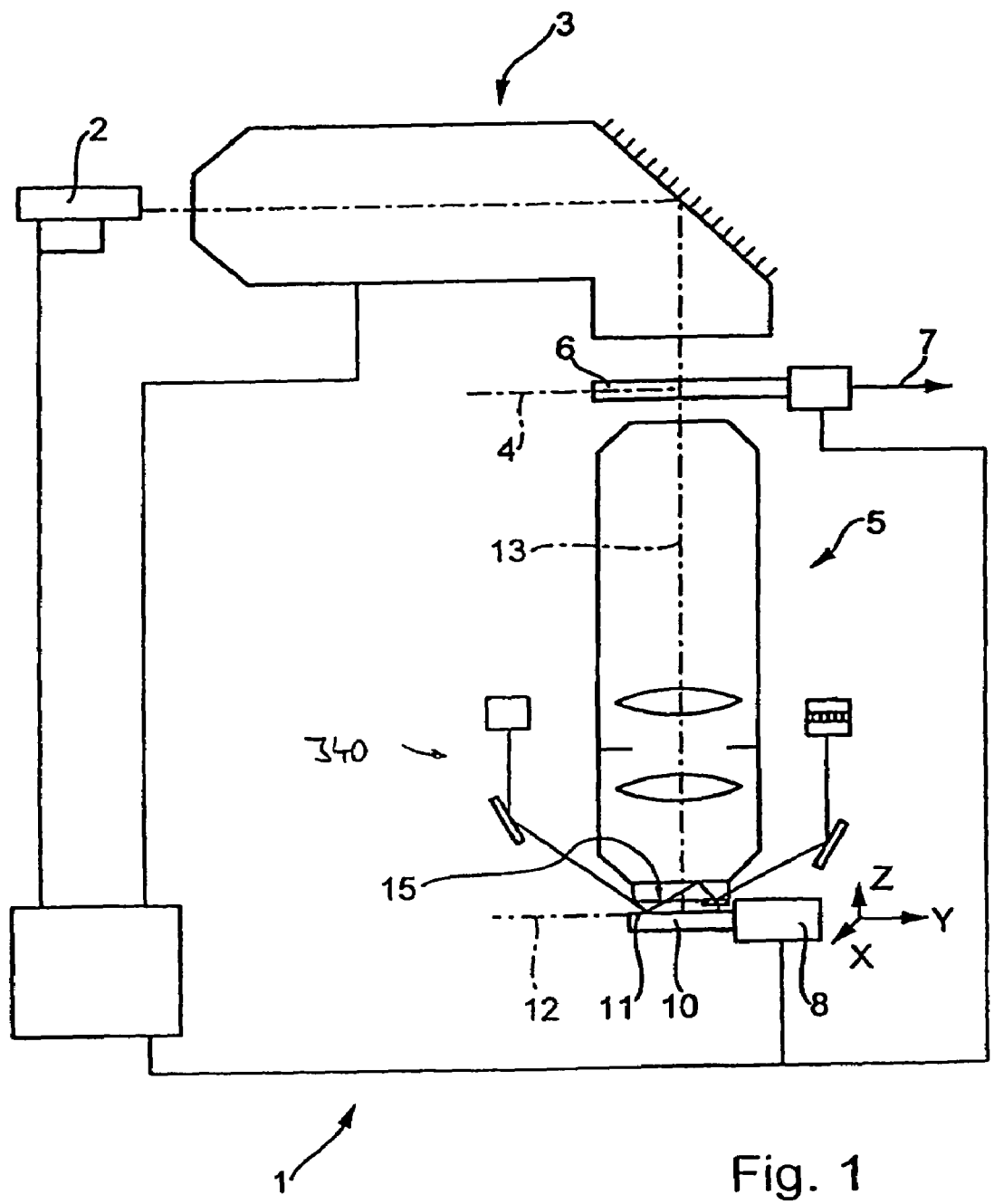
FIG. 1 shows a diagram of a microlithographic projection exposure machine in accordance with one embodiment of the invention.

FIG. 1 shows a diagram of a microlithographic projection exposure machine in the form of a wafer stepper 1 which is provided for manufacturing highly integrated semiconductor devices. The projection exposure machine 1 comprises as light source an excimer laser 2 with an operating wavelength of 157 nm, other operating wavelengths, for example 193 nm or 248 nm also being possible. A downstream illuminating system 3 produces in its exit plane 4 a large, sharply delimited, very homogeneously illuminated image field which is adapted to the telecentric requirements of the downstream projection objective 5. The illuminating system 3 has devices for selecting the illuminating mode and in the example can be switched over between conventional illumination with a variable degree of coherence, ring-field illumination and dipole or quadrupole illumination. Arranged downstream of the illuminating system is a device for holding and manipulating a mask 6 such that the latter lies in the object plane 4 of the projection objective 5 and can be moved in this plane for the purpose of scanning operation in a traversing direction 7.

Following downstream of the plane 4, also designated as mask plane, is the reduction objective 5, which projects an image of the mask on a reduced scale, for example the scale of 4:1 or 5:1 or 10:1, onto a wafer 10 occupied by a photoresist layer. The wafer 10 serving as photosensitive substrate is arranged such that the flat substrate surface 11 with the photoresist layer substantially coincides with the image plane 12 of the projection objective 5. The wafer is held by a device 8 which comprises a scanner drive, in order to move the wafer synchronously with the mask 6 and parallel to the latter. The device 8 also comprises manipulators in order to move the wafer both in the z-direction parallel to the optical axis 13 of the projection objective, and in the x- and y-directions perpendicular to the said axis. A tilting device with at least one tilting axis running perpendicular to the optical axis 13 is integrated.

Figure 2:
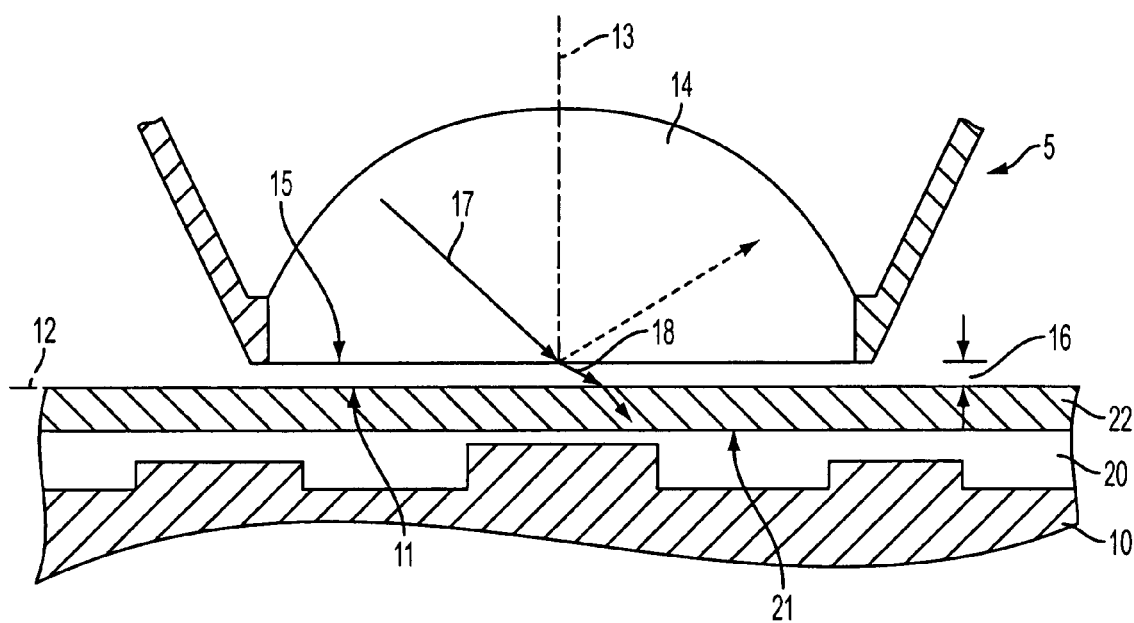
FIG. 2 is a diagrammatic, enlarged illustration of a transition region between an image-side end of a projection objective and a substrate to be exposed.

As last transparent optical component, next to the image plane 12, the projection objective 5 has a plano-convex lens 14 whose flat exit surface 15 is the last optical surface of the projection objective 5 and is arranged at a working distance 16 above the substrate surface 11 (FIG. 2).

The working distance 16 is substantially smaller than the operating wavelength of the projection exposure machine, and in this embodiment has a time average of approximately 10% of the operating wavelength, or between approximately 10 and approximately 20 nm. The machine is configured such that physical contact between exit surface 15 and substrate top side 11 is reliably avoided, in order to permit contactless projection lithography which spares the surfaces.

The projection objective 5 has a numerical aperture NA of more than 0.90, NA being >1.0 in some embodiments. The aperture is therefore higher than in the case of immersion lithography, since no high-index liquid is used. A maximum aperture of NA=(0.95* refractive index of the resist) in the region of approximately NA=1.7 can be favourable. In the case of conventional projection systems, under the conditions NA≧1.0, the edge and coma rays 17, running obliquely to the optical axis, for the edge of the aperture cannot be coupled out of the exit surface 15 of the objective, and thus cannot be coupled into the substrate surface 11 serving as incoupling surface of the substrate, since the entire light intensity impinging obliquely from the dense medium onto the boundary surface 15 is essentially totally reflected thereat. This problem is avoided in the case of the invention by virtue of the fact that the working distance 16 is selected to be so small that the incoupling surface 11 of the substrate lies in the region of the optical near field of the objective exit surface 15. If the distance 16 between the exit surface 15 and incoupling surface 11 is reduced so far that it falls below values of approximately 20% or 15% or 10% at least once during an exposure time interval, a light fraction 18 sufficient for the exposure can be coupled out of the objective and coupled into the photosensitive substrate. For example, the incoupling level reaches approximately 20% in the case of a distance of approximately 20% of the operating wavelength. A region useful for lithography begins here in the case of currently available resist materials.

A reliable exposure process with low tolerances with reference to the incoupled light intensity requires the working distance 16 to be maintained with narrow tolerances essentially over the entire surface to be exposed. In order to render this possible, a planarization technique which provides a substantially flat incoupling surface 11 for the illuminating light irrespective of the surface topography is used in the case of the embodiment described here. In the example of FIG. 2, the surface of the wafer 10 is already structured in steps by preceding process steps. The first step is now to apply to the etched surface structure a layer 20 composed of planarizing resist which is transparent to the exposing light but does not experience any substantial structural changes under irradiation. The planarization layer 20 has a substantially flat surface 21 to which a thin layer 22 composed of photosensitive photoresist is then applied, the layer thickness thereof being uniform. The virtually optically flat free surface 11 of the photoresist layer forms the incoupling surface for the exposing light coupled out of the projection objective. In the case of one embodiment (not shown), a layer of photoresist is firstly applied to the semiconductor surface, prestructured if appropriate, before there is applied thereto a layer of transparent planarization photoresist whose surface forms the incoupling surface 11. In each case, the planarization technique produces a largely flat incoupling surface 11 which promotes uniform exposure during contactless near field projection lithography.

Figures 3A, 3B:
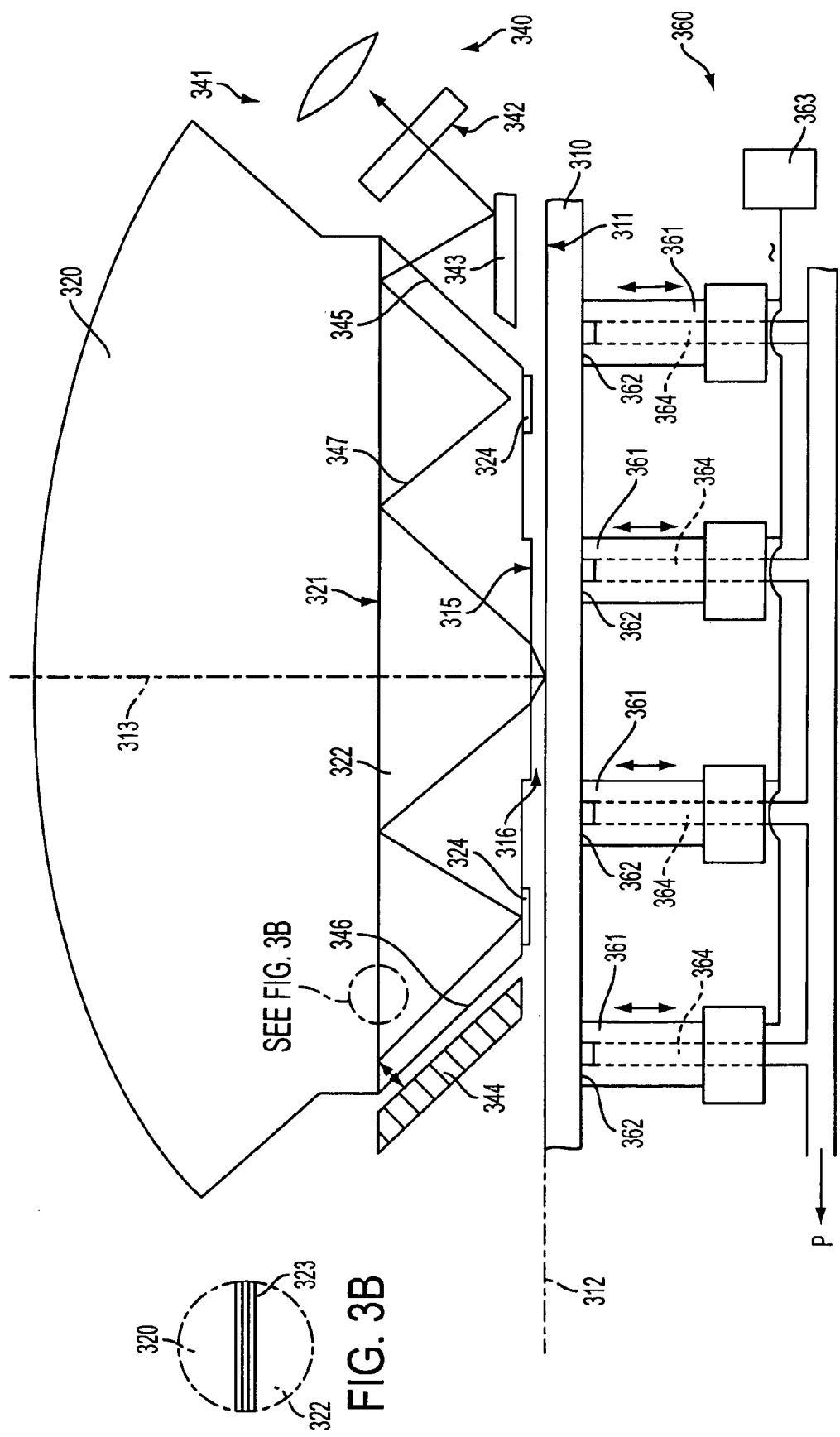
FIGS. 3A and 3B are diagrammatic illustrations of a focus detection system and of a device for controlled deformation of a wafer in accordance with one embodiment of the invention.

FIGS. 3A and 3B explain further measures which promote contactless near field projection lithography and can be provided individually or in combination in the case of embodiments of projection exposure systems according to the invention. These measures comprise a high-precision focusing technique which operates with high measuring accuracy even given very small working distances, and also comprise the possibility of targeted deformation of the substrates to be exposed, in order to set a substantially flat substrate surface.

In its embodiment shown in FIGS. 3A and 3B, the projection objective has a bipartite last optical element. The latter comprises a plano-convex lens 320 with a spherical or aspheric entrance surface and flat exit surface 321 to which a transparent end plate 322 is wrung or is optically coupled via immersion. Located between the plano-convex lens 320 and the end plate 322 is a multiply, single ply or gradient coating 323 which has an antireflecting effect for the operating wavelength of the projection objective, and acts as a reflecting layer in the visible wavelength region, in particular at approximately 633 nm. The end plate 322 has an exit side which is provided with flat steps and whose outwardly projecting part forms the exit surface 315 of the projection objective. Applied to the edge of the exit side are coatings 324 which have an antireflecting effect for the operating wavelength and act as reflecting layer for visible light, for example 633 nm.

In this embodiment, the end plate 322 is used as a functional part, which can be transirradiated, of a focus detection system 340 which serves for detecting deviations between the image plane 312 of the projection objective and the incoupling surface 311, to be arranged in the region of the image plane, of the wafer 310. The measurement results of the interferometric focus detection system 340 can be used as the basis for correcting the relative position between the projection objective and wafer, for example by suitably moving the wafer in the z-direction (parallel to the optical axis of the projection objective) and/or by moving the projection objective with reference to the wafer holder along the optical axis. The focus detection system comprises an incoupling/outcoupling optics 341 with a Fizeau surface 342, a deflecting mirror 343 and a mirror 344 serving as a retroreflector. In order to be able to couple the measuring light of the focus detection system (laser light of wavelength 633 nm) into and out of the end plate 322, the latter has at its edge flat incouplling/outcoupling surfaces 345, 346 which lie opposite one another and are aligned such that a measuring beam 347 of the focus detection system is coupled in or coupled out in a fashion substantially perpendicular to the incoupling surfaces.

The focus detection system 340 is an interferometer system in which the measuring beam 347 obliquely strikes the incoupling surface 311 of the substrate, which has a reflecting effect, and is reflected therefrom. Changes in the distance between the exit surface 315 and incoupling surface 311 are observed as variations in wavelength for the measurement beam which can be detected and evaluated interferometrically. The measurement beam is coupled obliquely from below into the plate 322 via the mirror 343 and the incoupling surface 345, and has inside the plate a zigzag beam profile in the case of which the measurement beam is repeatedly reflected between the lens-side reflection coating 323 and coatings 324 on the exit side. In the central measuring region near the optical axis 312 of the system, the measurement beam emerges from the plate 322, strikes the incoupling surface 311, from which it is reflected, and thereafter re-enters the end plate 322. After emerging from the outcoupling surface 346, the beam is reflected into itself by the mirror 344 and passes, running in a zigzag fashion after repeated deflection into the incoupling/outcoupling optics 341 for the purpose of evaluation. The aperture of the interferometric beam path is advantageously adapted to the working distance 316, it being possible, for example, for the aperture of the interferometric beam path to be >1 given a working distance of <$\lambda$/5, or for the aperture of the interferometric system to be <1 given a distance 316 of more than 4$\lambda$–5$\lambda$. The design can be calibrated with respect to a plane mirror which can consist of silicon, if appropriate, in which case the said mirror itself should have a surface accuracy of greater than PV<5 nm, and can be positioned in nm steps. Since the resist refractive indices can be very high, there is normally a sufficiently good reflection from the resist.

By virtue of the fact that the exit end of the projection objective is incorporated into the focus detection system as a reflecting and light-guiding element, the measurement beam 347 can be irradiated onto the wafer surface 311 with an incident angle which is substantially steeper than an irradiation angle which would be possible with conventional focus detection systems of which a measurement beam is irradiated directly with grazing incidence between the exit surface of the projection objective and the wafer surface. A relatively high measuring accuracy can thereby be achieved despite a very small working distance.

In order to be able to provide a substantially flat incoupling surface 311 even in the case of very thin and thus possibly flexible substrates, for example in the case of semiconductor wafers, a device 360 is provided in the case of the embodiment shown for the purpose of actively supporting the wafer by means of controlled supporting points, with the aid of which device a targeted deformation of the wafer can be carried out if required. The device 360 integrated in the substrate holding device comprises a multiplicity of support members 361 which are arranged in a regular, two-dimensional array and have at their upper ends supporting surfaces 362 on which the wafer 310 to be supported lies. Each of the support members can be adjusted in height with the aid of an electrically driveable actuator, for example a piezoelectric element, independently of the other support members. The adjusting elements are driven by a common control device 363 which processes the input signals which are based on measurement results of the focus detection system 340. This results in the creation of a control loop in the case of which the wafer can be adjusted and/or deformed in accordance with the results of a distance measurement and/or a measurement of the surface form such that a substantially flat incoupling surface 311 results. In order to ensure that an adjustment of the support members has a direct effect on the deformation of the wafer 310, the support members are fashioned in the region of their supporting surfaces such that they can act on the underside of the wafer in the manner of suction cups. For this purpose, a pressure duct 364 which opens in the region of the supporting surface and is connected to a suction device (not shown) runs in each support member 361. The suction device produces in the duct system 364 an underpressure which ensures that the wafer 310 adheres reliably to the supporting surfaces of the support members without being lifted off. In order to facilitate a change of substrate, the pressure system can be switched over briefly to normal pressure or overpressure in order to facilitate detachment of the wafer from the support members or actively to promote the same.

The setting of a desired surface profile of the incoupling surface 311 can be carried out in various ways. It is possible to examine the wafer surface 311 to be exposed for surface deformations before the exposure by using appropriate measuring methods, for example interferometrically or with the aid of another optical distance measurement, and to deform the wafer with the aid of the active wafer support such that the surface deformation remains below a prescribed limiting value which can be fixed, for example, to $\leq$3 nm. Once the wafer surface has been set in this way, it can be focused, tilted if appropriate and exposed. A deformation before and/or during the laser exposure for setting a desired surface profile is also possible in conjunction, at the same time, with focusing and, if appropriate, tilting or the like.

The active wafer support with the possibility of a targeted deformation of the incoupling surface 311 can also be used for Petzval correction, if specific residual amounts of the field curvature are left from the projection objective. Consequently, the device 360 can also be used, for example, to set a non-infinite, large radius of curvature (convex or concave relative to the objective) for the incoupling surface 311. A cylindrical curvature can also be set for scanning systems.

Systems which permit a targeted deformation of wafers are known per se. Examples are shown in the patents U.S. Pat. No. 5,094,536 or U.S. Pat. No. 5,563,684. These systems can also be used in embodiments of the invention, given appropriate modification. The disclosure content of these documents is incorporated in this description by reference.

A rapid contamination of the objective exit side can come about in the case of contactless near field projection lithography on the basis of the small working distance between the exit surface of the projection objective and the chemical substances to be irradiated with UV light, and the wafer throughput and the imaging performance can be reduced thereby. One possibility for reducing disadvantages caused by contamination consists in providing as last optical element a thin plane plate which is wrung onto the last but one element and can easily be exchanged by detachment from the said element. Instead of this exchangeable plate being wrung, it can also be brought into optical contact with the last lens element (plano-convex lens) via an immersion fluid. This exchangeable element can serve as a "dirt trap", and can be detached, cleaned and wrung or applied again, or be replaced by another element. A seamless optical contact between the exchangeable plate and the adjoining optical element is particularly important, since only in this way is it possible to transmit large numerical apertures, in particular with values NA>1.

A possibility for simultaneously providing a flat incoupling surface and minimizing contamination problems is explained with the aid of FIGS. 4A and 4B. In the case of this variant method, a thin or a relatively thick plane-parallel plate 400 consisting of transparent material is laid onto the substrate 410 to be exposed or onto the resist layer 422. In this variant, the narrow bridging gas space (working distance 416) to be bridged by the optical near field is formed between the objective-side plane surface 411 of the plane plate and the preferably flat exit surface 415 of the objective. This thin air gap of, for example, $\lambda/10$–$\lambda/20$ is therefore no longer located directly in front of the resist layer (or a planarization layer), but at a larger distance, for example of the order of magnitude of one or more millimetres therefrom. If the plane plate rests directly on the resist layer or a planarization layer, direct optical contact may come about, as may a virtual optical contact at a slight distance, possibly in some regions. In the second case, an optical near field will predominantly be present at a distance of much less than $\lambda/20$ of the operating wavelength, and so exposure via the near field is possible. The plane plate 400 serving as auxiliary plate can be used repeatedly, and should be carefully cleaned after each exposure cycle. The plane-parallel plate 400 is preferably dimensioned such that there is coverage of the entire surface of the substrate to be exposed; consequently, auxiliary plates for the semiconductor structuring can have diameters in the range of between approximately 200 mm and 300 mm or more. It is possible for the auxiliary plate to be laid onto the resist layer directly after the application and drying of the resist material in vacuum, and for the wafer to be installed in the substrate holding device with the auxiliary plate laid on.

If the plane plate 400 is made sufficiently thick and flexurally stiff, it can suffice to press the region of the substrate to be exposed against the substrate-side plane surface 421. For this purpose, the substrate holding device of the embodiment shown comprises a pressure device 440 which comprises a number of pressure channels which open into pressure pockets 442 in the wafer exposure region, that is to say in the region of the optical axis of the projection objective on the flat surface 441 of the substrate holding device. The relative displacement between the substrate to be exposed and the projection objective comes about in this variant between the stable auxiliary plate 400 and the plane exit surface 415 of the lithography objective.

Whereas in the example shown the plane plate 400 is laid directly onto the photoresist layer without a spacing, it is also possible for a plane-parallel plate to be laid onto a planarized, but unexposed wafer with the interposition of an immersion fluid, for example a suitable immersion liquid. The relative displacement continues to take place via a small gap 416 which is a few millimetres above the image plane 412. This variant has the advantage that the exposure can be carried out at known high speeds despite the use of an immersion fluid. The introduction and removal of immersion fluid can be carried out outside the scanner, for example at the same time as a current exposure. It may be possible with this variant to achieve the currently achievable wafer throughput of, for example, approximately 140 wafers (with a diameter of 300 mm) per hour even for apertures of NA>1.0. This corresponds to a throughput which is currently possibly only for apertures <1.0.

In order to prevent accidental wringing of the parts between the auxiliary plate 401 and the exit surface 415 of the projection objective in conjunction with uncontrolled changes in spacing, it is provided in the case of the embodiment shown to apply a thin layer 450, 451 made from magnesium fluoride both to the exit surface 415 of the projection objective and to the object-side plane surface 411 of the auxiliary plate 400, which layer is designed as an optically neutral protective layer and can, for example, have an optical layer thickness of $\lambda$.

The projection system of the invention as explained with the aid of a few examples renders possible projection exposures with very high apertures, in particular even with apertures of NA>1, for example NA=1.1 or above up to NA=1.7. Both purely refractive (dioptric) and catadioptric projection objectives can be used for contactless near field projection lithography.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

What is claimed is:

1. A method for manufacturing a finely structured component, the method comprising:
   providing a mask with a prescribed pattern in an object plane of a projection objective;
   providing a photosensitive substrate in a region of an image plane of the projection objective;
   illuminating the pattern with ultraviolet light of a prescribed operating wavelength;
   projecting an image of the pattern onto the photosensitive substrate using the projection objective; and
   setting a finite working distance between an exit surface, assigned to the projection objective and an incoupling surface, assigned to the substrate, for exposing light,
   wherein, during at least a portion of an exposure time interval, the working distance is set to a value which is smaller than a maximum extent of an optical near field of light emerging from the exit surface.

2. The method according to claim 1, wherein at least temporarily a finite working distance is set which is less than approximately 50% of the operating wavelength.

3. The method according to claim 1, further comprising coating the substrate with at least one planarization layer for producing a substantially flat substrate surface which is used as incoupling surface.

4. The method according to claim 1, further comprising optical detection of deviations between the image plane of the projection objective and the incoupling surface.

5. The method according to claim 4, wherein the optical detection comprises an oblique irradiation of at least one measurement beam into an interspace between the exit surface of the projection objective and the incoupling surface, as well as detection of the measurement beam after reflection at the substrate surface, and wherein the irradiation is carried out in such a way that before detection the measurement beam is reflected at least once at the substrate surface and at least once at a reflection surface of the projection objective which is reflective to the measurement light.

6. The method according to claim 4, wherein a last optical element of the projection objective capable of being transirradiated by the measurement beam is used as a beam-guiding constituent of a focus detection system.

7. The method according to claim 1, further comprising controlled deformation of the substrate in order to produce a substantially flat substrate surface which can be used as incoupling surface.

8. The method according to claim 7, further comprising actively supporting the substrate on at least three supporting surfaces of support members, and adjusting an axial position of at least one of the supporting surfaces relative to other supporting surfaces in order to set a desired form of the substrate surface by controlled deformtion of the substrate.

9. The method according to claim 7, wherein the controlled deformation of the substrate is performed at least one of before the exposure time interval and during the exposure time interval.

10. The method according to claim 7, further comprising pressing the substrate against supporting surfaces of at least three support members by producing an underpressure at a side of the substrate averted from the incoupling surface.

11. The method according to claim 1, further comprising:
providing a thin transparent plate;
making optical contact between the thin transparent plate and a last optical element of the projection objective in such a way that the last optical element, at which the exit surface is located, is formed by the thin transparent plate;
carrying out at least one exposure; and
exchanging the thin transparent plate.

12. The method according to claim 11, wherein optical contact is made by wringing.

13. The method according to claim 11, wherein optical contact is made with the aid of an immersion liquid which is introduced between the last optical element and the thin plate.

14. The method according to claim 1, further comprising:
providing a transparent plane plate; and
laying the transparent plane plate onto the substrate in such a way that an objective-side plane surface, averted from the substrate, of the transparent plane plate forms the incoupling surface.

15. The method according to claim 14, wherein the plane plate is laid onto the substrate such that it is in physical contact with a top side of the substrate at least in some region.

16. The method according to claim 14, wherein a region between a substrate-side plane surface of the plane plate and a top side of the substrate is filled in part or completely by an immersion medium.

17. The method according to claim 14, wherein a plane plate is used which covers substantially the entire area of the substrate to be exposed.

18. The method according to claim 17, wherein a relative displacement is carried out during the exposure between the projection objective and the plane plate in order to expose successively all the regions of the substrate which is to be exposed.

19. The method according to claim 14, further comprising actively pressing the substrate against a substrate-side plane surface of the plane plate in order to produce physical contact at least during the exposure.

20. A projection exposure system for projecting a pattern, arranged in an object plane of a projection objective, into an image plane of the projection objective using ultraviolet light of a prescribed operating wavelength, comprising:
a multiplicity of optical elements which are arranged along an optical axis and comprise a last optical element of the projection objective, wherein the last optical element of the projection objective forms an exit surface of the projection objective,
wherein the projection objective is designed such that a finite working distance between the exit surface and the image plane is smaller than a maximum extent of an optical near field of light emerging from the exit surface.

21. The projection exposure system according to claim 20, wherein the working distance is less than approximately 50% of the operating wavelength.

22. The projection exposure system according to claim 20, in which the projection objective has an image-side numerical aperture of NA>0.85.

23. The projection exposure system according to claim 20, further comprising:
a focus detection system for the optical detection of deviations between the image plane of the projection objective and an incoupling surface to be arranged in the region of the image plane, the focus detection system including:
an incoupling system for oblique irradiation of at least one measurement beam, intended to be reflected at the incoupling surface, into an interspace between the exit surface of the projection objective and the incoupling surface; and
an outcoupling system for detecting the measurement beam after reflection at the incoupling surface;
wherein the incoupling system and the outcoupling system are designed and arranged in such a way that before entry into the outcoupling system the measurement beam is reflected at least once at the incoupling surface assigned to the substrate and at least once at a reflection surface reflective to the measurement light, of the projection objective.

24. The projection exposure system according to claim 23, wherein the last optical component of the projection objective has an exit side which, at least in one region, has a coating which is reflective to the measurement light of the focus detection device.

25. The projection exposure system according to claim 23, in which the focus detection system comprises a last optical component of the projection objective as beam-guiding part capable of being transirradiated by the measurement beam.

26. The projection exposure system according to claim 23, wherein the projection objective has a last optical component with an edge region in which there is constructed at at least one area a flat surface aligned obliquely to the optical axis, the flat surface being used as at least one of an incoupling surface and an outcoupling surface for a measurement beam of the focus detection system.

27. The projection exposure system according to claim 20, further comprising a device for actively supporting the substrate, the device being set up for a controlled deformation of the substrate in order to produce a prescribable form of the substrate surface.

28. The projection exposure system according to claim 27, wherein the device comprises a multiplicity of support members with supporting surfaces for the substrate, it being possible to adjust the height of support members independently of one another.

29. The projection exposure system according to claim 27, wherein the device comprises a suction device for actively sucking the substrate onto the supporting surfaces of the support members.

30. The projection exposure system according to claim 27, wherein the device for actively supporting the substrate is controlled in accordance with measurement signals of a focus detection system.

31. The projection exposure system according to claim 20, which is assigned at least one plane plate consisting of material transparent to light of the operating wavelength, and arranged on the substrate in such a way that the incoupling surface is formed by an objective-side plane surface of the plane plate.

32. The projection exposure system according to claim 31, wherein the plane plate is dimensioned such that it substantially covers the entire surface of the substrate to be exposed.

33. The projection exposure system according to claim 31, wherein applied on at least one of the exit surface of the projection objective and an objective-side plane surface of the plane plate is a coating for preventing wringing of the surfaces to one another in the event of physical contact.

34. The projection exposure system according to claim 33, wherein the coating essentially consists of magnesium fluoride.

35. The projection exposure system according to claim 20, wherein a substrate holder for holding the substrate comprises a pressure device for producing an overpressure between a surface of the substrate holder and a substrate laid thereupon.

36. The projection exposure system according to claim 20, which is designed for an operating wavelength of less than 260 nm.

37. A method for manufacturing a finely structured component, the method comprising:
    providing a mask with a prescribed pattern in an object plane of a projection objective;
    providing a photosensitive substrate in a region of an image plane of the projection objective;
    illuminating the pattern with ultraviolet light of a prescribed operating wavelength;
    projecting an image of the pattern onto the photosensitive substrate using the projection objective; and
    setting a finite working distance between an exit surface, assigned to the projection objective and an incoupling surface, assigned to the substrate, for exposing light,
    wherein, during at least a portion of an exposure time interval, the working distance is set to a value which is smaller than a maximum extent of an optical near field of light emerging from the exit surface such that an incoupling efficiency of at least 20% is obtained, and
    wherein the incoupling efficiency is defined as a ratio of a transmission of a maximum marginal or coma rays to a transmission of chief rays during coupling out from the exit surface and during coupling into the incoupling surface.

38. The method according to claim 37, wherein projecting of the image of the pattern onto the photosensitive substrate in performed at an image side numerical aperture $NA \geq 1$.

39. The method according to claim 38, wherein projecting of the image of the pattern onto the photosensitive substrate in performed without use of an immersion fluid in contact with the exit side of the projection objective.

40. A method for manufacturing a finely structured component, the method comprising:
    providing a mask with a prescribed pattern in an object plane of a projection objective;
    providing a photosensitive substrate in a region of an image plane of the projection objective;
    illuminating the pattern with ultraviolet light of a prescribed operating wavelength;
    projecting an image of the pattern onto the photosensitive substrate using the projection objective; and
    setting a finite working distance between an exit surface, assigned to the projection objective and an incoupling surface, assigned to the substrate, for exposing light,
    wherein, during at least a portion of an exposure time interval, the working distance is set to a maximum distance at which evanescent fields of light present in an immediate vicinity of the exit surface are coupled into the incoupling surface.

* * * * *